(12) United States Patent
Jung et al.

(10) Patent No.: US 6,333,704 B1
(45) Date of Patent: Dec. 25, 2001

(54) CODING/DECODING SYSTEM OF BIT INSERTION/MANIPULATION LINE CODE FOR HIGH-SPEED OPTICAL TRANSMISSION SYSTEM

(75) Inventors: Hee Young Jung; Yong Jin Kim; Byoung Moon Jin; Kyung Rok Cho, all of Taejon (KR)

(73) Assignee: Electronics and Telecommunications Research Institute, Taejon (KR)

(*) Notice: Subject to any disclaimer, the term of this patent is extended or adjusted under 35 U.S.C. 154(b) by 0 days.

(21) Appl. No.: 09/432,756

(22) Filed: Nov. 3, 1999

(30) Foreign Application Priority Data

Nov. 11, 1998 (KR) .................................................. 98-48233

(51) Int. Cl.$^7$ .............................. H03M 5/00; H03M 5/02
(52) U.S. Cl. ................................................ 341/58; 341/56
(58) Field of Search .............................. 341/58, 101, 56, 341/59, 69; 375/242, 292, 265; 709/231

(56) References Cited

U.S. PATENT DOCUMENTS

| | | |
|---|---|---|
| 4,309,694 | 1/1982 | Henry . |
| 4,620,311 | * 10/1986 | Immink ................................. 375/292 |
| 5,012,240 | * 4/1991 | Takahashi et al. .................... 341/101 |
| 5,022,051 | 6/1991 | Crandall et al. . |
| 5,200,979 | 4/1993 | Harris . |

OTHER PUBLICATIONS

Hollmann et al, "Performance of Efficient Balanced Codes," IEEE, 913–918, May 1991.*

"DmBIM Code and its Performance in a Very High–Speed Optical Transmission System" by Satoki Kawanshi, IEEE Transactions on Communications, vol. 36, No. 8, Aug. 1998, pp. 951–956.

"A DC–Balanced, Partitioned–block, 8B/10B Transmission Code" by A. X. Widmer et al., IBM J. Res. Develop., vol. 27, No. 5, Sep. 1983, pp. 140–151.

"Transmission Performance Analysis of a New Class of Line Codes for Optical Fiber Systems" by Witold A. Krzymien, IEEE Transactions on Communications, vol. 37, No. 4, Apr. 1989, pp. 402–404.

* cited by examiner

*Primary Examiner*—Patrick Wamsley
(74) *Attorney, Agent, or Firm*—Antonelli, Terry, Stout & Kraus, LLP

(57) ABSTRACT

There is provided a coding/decoding system of bit insertion manipulation line code, which has small increase in bit rate and simple configuration and minimizes DC baseline fluctuations by properly coupling the advantages of mBnB code and bit insertion code in a high-speed optical transmission system using AC coupling. The encoding part of the system inserts a bit for minimizing a disparity of m+1 bit block when a disparity with respect to m-bit input information is a minimum value that the m+1 bit block may have, and inserts '0' when it is not, performing pre-coding. Then, the encoding part manipulates a part of the bits of the pre-coded block to make its disparity have the minimum value, compares the disparity of the pre-coded block with a disparity accumulated, and inverts or non-inverts the block, thus carrying out coding. The decoding part removes the insertion bit from the coded information, inverts the block again when it is inverted during the encoding, and performs a manipulation opposite to the bit manipulation, thus executing decoding.

11 Claims, 4 Drawing Sheets

CODING/DECODING SYSTEM OF BIT INSERTION/MANIPULATION LINE CODE FOR HIGH-SPEED OPTICAL TRANSMISSION SYSTEM

BACKGROUND OF THE INVENTION

1. Field of the Invention

The present invention relates to a coding/decoding system of bit insertion/manipulation line code for a high-speed optical transmission system. More particularly, it relates to a coding/decoding of bit insertion/manipulation (BIM) line code for a high-speed optical transmission system using AC coupling, which keeps a running digital sum (RDS), essential for transmission of binary data at a high-speed, zero, and minimizes the digital sum variation with simple configuration.

2. Description of the Related Art

Except that line codes used in the general optical transmission system use only codes of low levels due to the optical device characteristics, they have the requirements similar to those used in the following conventional transmission system using AC coupling.

First, the conventional transmission system must have bit sequence independence. Second, the fluctuation of the DC baseline of the bit stream should be minimized to be neglected at its receiving part. Third, the system must have the in-service error monitoring capability of detecting transmission errors even during data transmission. Fourth, sufficient bit transitions in the codeword must be guaranteed for the timing extraction at the receiving part. Fifth, if the structures of encoder/decoder are not simple, it is difficult to provide the required transmission performance at high-speed and increases the overall costs. Therefore, the system should be realized in a simple hardware.

Sixth, minimizing an increase in bit rate is very important in the high-speed transmission system, and that is because the increase in bit rate raises the operation clock rate, thus making it difficult to realize an electronic circuit in high-speed application. Seventh, the case where there are the same consecutive bits (i.e. consecutive '0' or '1') in a bit stream also causes a limit to the system performance, and that is because the long continuity of the same bits makes it difficult to extract timing information and causes the DC baseline fluctuation.

Conventionally, a method of using a codeword with a bit rate twice as high as the information data's as a transmission code in order to transmit binary data (disclosed in [AMI: Barker R. H, B.P. 706,687], [CMI: CCITT Rec. G. 722], [Manchester:IEEE 802.3 Ethernet], etc.) has been employed. This method assures the BSI and DC balance and easily extracts clock component from the bit stream. However, this method should generate a codeword having bit rate twice as high as the information data's. Thus, it is not suitable for the applications having high bit rate such as high-speed optical transmission system since it is difficult to realize the system employing electronic circuits in a small size, low power consumption and requires a lot of cost.

In order to solve the above problem, in 1960's, mBnB (m=natural number, m2, n3) line code that satisfies the DC balance and minimizes an increase in bit rate was proposed. (4B5B, 5B6B [R. Petrovic, Electronic Letters, 1988, Vol. 24, No. 5, pp274 to 275] in FDDI, 8B10B in Fibre Channel, etc.). However, this method adopts the lookup table using a read only memory (ROM) in order to convert the m-bit information data into n-bit codewords with DC balance, resulting in restricted data transmission speed due to the ROM with relatively low operating speed. Even if the ROM is not used, the larger the value m becomes, the more complicated an encoder/decoder circuit becomes whereby a high-speed electronic circuit cannot be realized.

In the 1980's, there was proposed a method using a bit insertion code that inserts 1-bit indication bit into m-bit information data to minimize the increase in bit rate for the high-speed optical transmission of data of more than several hundred megabits and simplifies the configuration of the encoder/decoder ([mB1C: IEEE Tran. COM, Vol. COM-32, No. 2, pp 163 to 168, 1984, Moriaki Yoshikai, et al], [DmB1M: IEEE J. on SAC, Vol. SAC-4, No. 9, pp. 1432 to 1437, 1986, Moriaki Yoshikai et al], [PFmB(m+1): IEEE Tran. COM, Vol. COM-37, No. 4, pp. 402 to 404, 1989, Witold A. Krzymien], [U.S. Pat. No. 5,200,979 High Speed Telecommunication System using a novel line code, 1993, Gwendolya K. Harris]. As an example of this method, the mB1C code simplifies the structure of the encoder/decoder by inserting a complementary 1 bit of the least significant bit of the information data into the information data. In addition, it produces at least one bit transition at every m bit to facilitate the clock extraction at the receiving part but the DC balance is not guaranteed.

In order to obviate the above problems, there has been developed DmB1M code obtained by inserting the insertion code and then exclusive-Oring information bits by bit to have average DC balance.

PFmB(m+1) code was developed to more compensate the DC balance problem. The PFmB(m+1) code is created by inserting bits minimizing the DC balance of the information data and performing pre-coding. With the PFmB(m+1) code, in order to minimize the DC balance, '0' is inserted if the polarity of disparity of the information data is positive (+), and '1' is inserted if it is negative (1). The polarity of the information data pre-coded as above is compared with the polarity of data accumulated during transmission, and, if they are opposite to each other, the information data is transmitted without any change, but if they are identical to each other, the information data is inverted to be transmitted, thereby maintaining the overall DC balance.

However, though the bit insertion method has a small increase in bit rate and a simple mechanism compared to the mBnB code, it has big DC baseline fluctuations by maintaining at most the average DC balance.

SUMMARY OF THE INVENTION

Accordingly, the present invention is directed to a encoding/decoding apparatuses according to bit insertion/manipulation for a high-speed optical transmission system, which minimizes DC baseline fluctuations with a small bit increase rate and simple mechanism by properly coupling advantages of the conventional mBnB line code and bit insertion code.

In order to achieve the above object of the present invention, the present invention provides a encoding/decoding system of bit insertion/manipulation line code, which includes an encoding part of converting information data into codewords, and a decoding part of recovering the codewords received through a transmission path into the information data. The encoding part inserts a bit for minimizing a disparity of m+1 bit block when a disparity of m-bit input information is a minimum value that the m-bit block may have, and inserts '0' when it is not, to perform pre-coding. Then, the encoding part manipulates a part of the bits of the pre-coded block to make its disparity have the minimum value, and compares the disparity of the pre-coded block with a disparity value accumulated, and inverts or non-inverts the block, thus performing coding. The decoding part removes the insertion bit from the coded information, inverts the block again when it is inverted during encoding, and carries out manipulation opposite to the bit manipulation, thus executing decoding.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
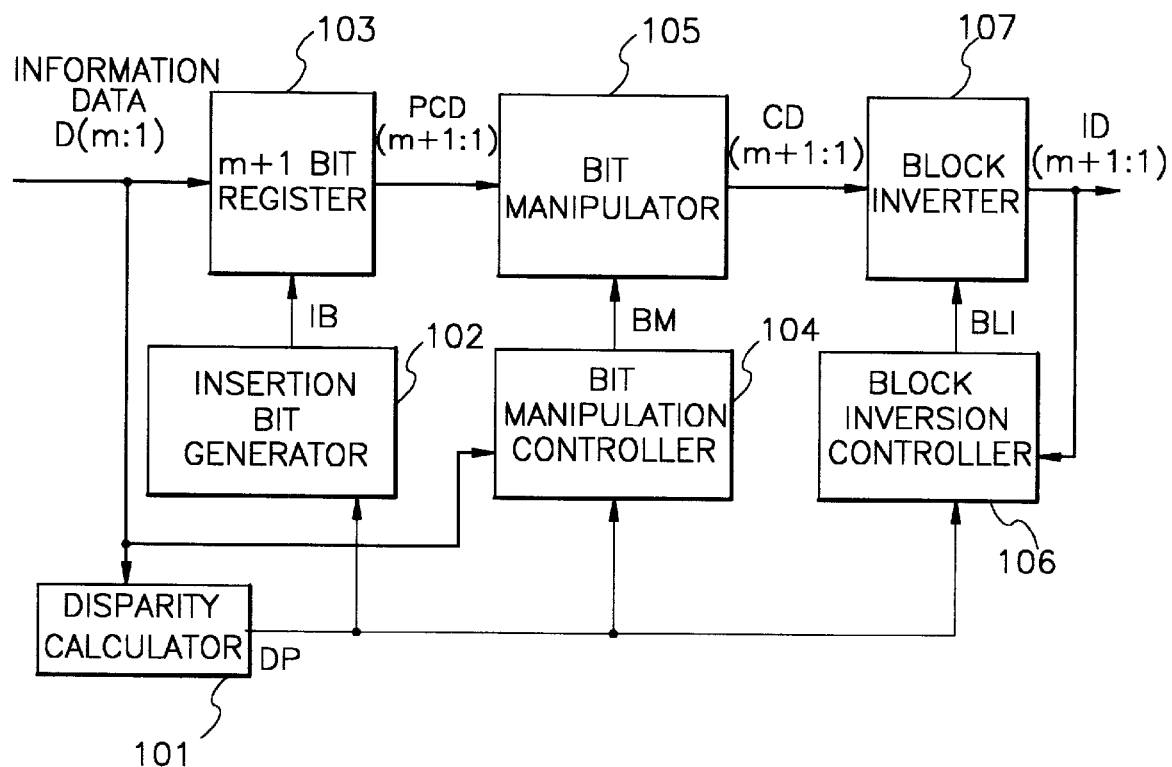
FIG. 1 is a block diagram of a coding apparatus of BIM line code in accordance with the present invention.
Figure 2:
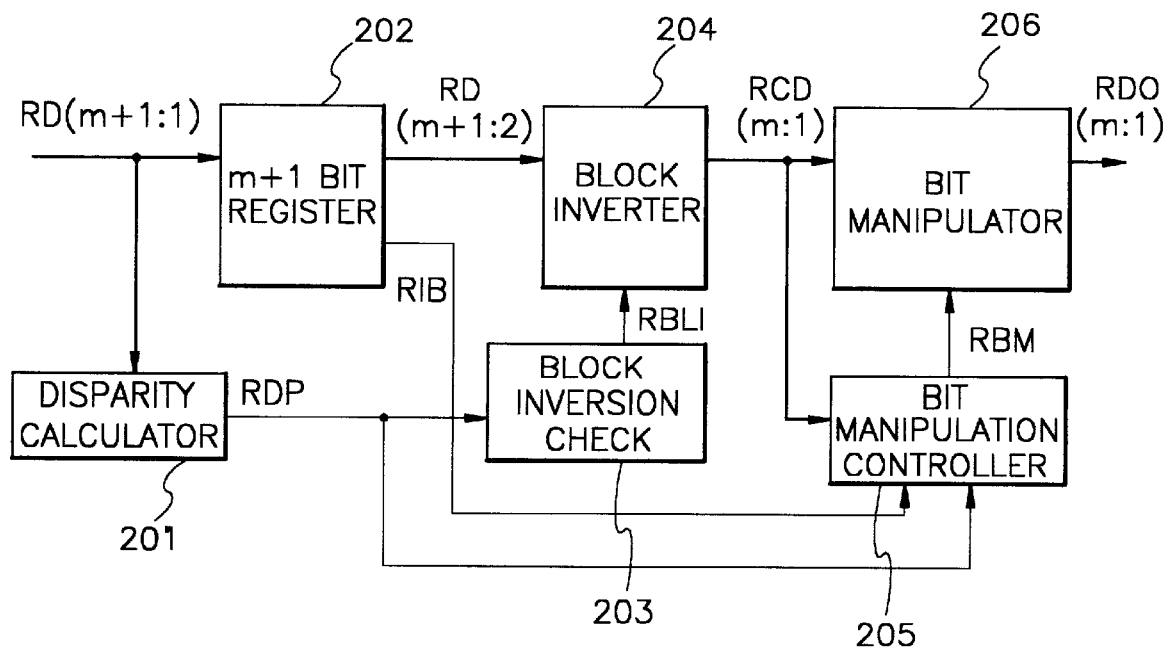
FIG. 2 is a block diagram of a decoding apparatus of BIM line code in accordance with the present invention.

FIG. 1 is a block diagram of a coding apparatus of BIM line code in accordance with the present invention, and FIG. 2 is a block diagram of a decoding apparatus of BIM line code in accordance with the present invention.

Figure 3:
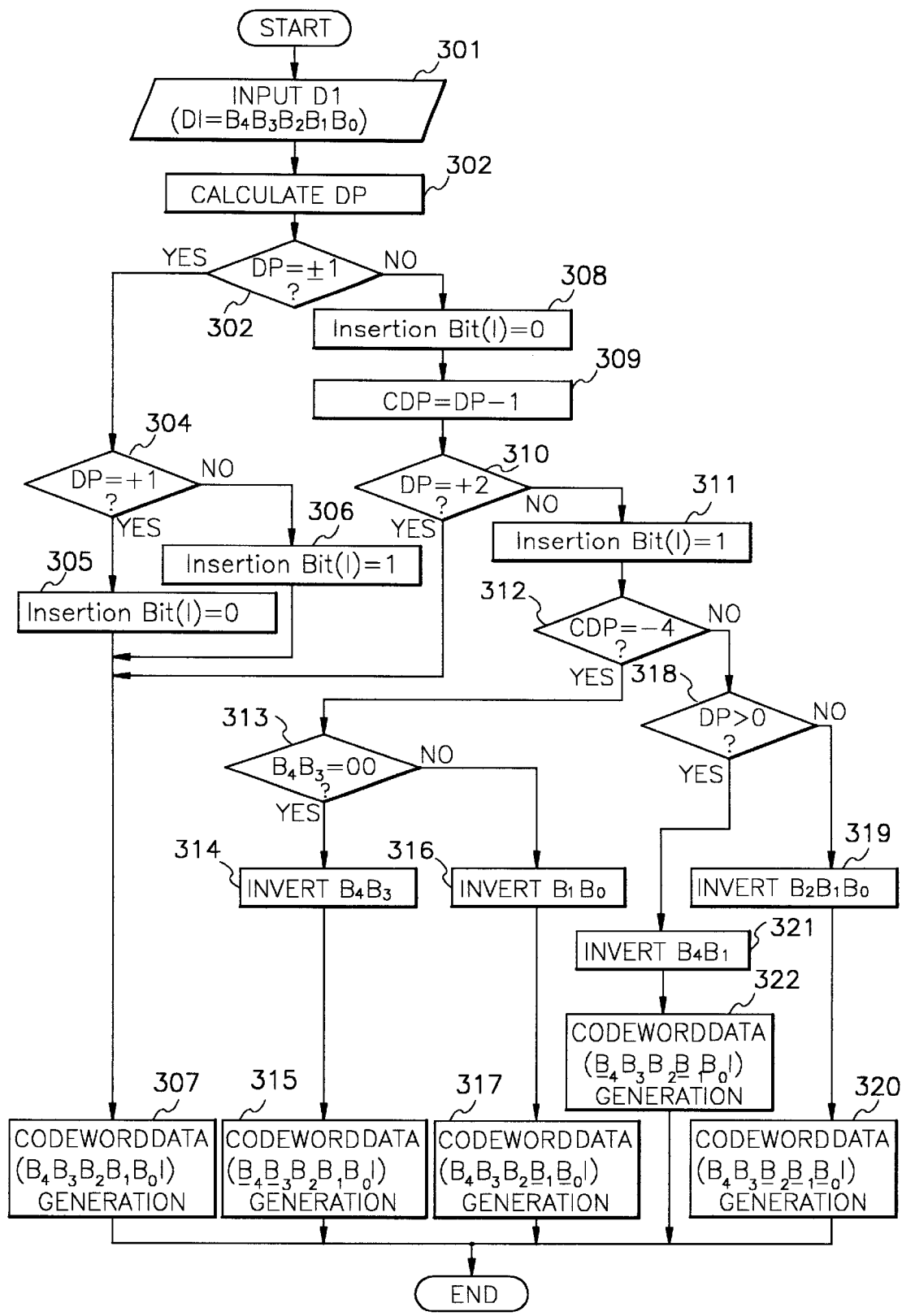
FIG. 3 shows a processing flow chart of pre-coding and bit manipulation of 5B6B line code in accordance with a first preferred embodiment of the resent invention.
Figure 4:
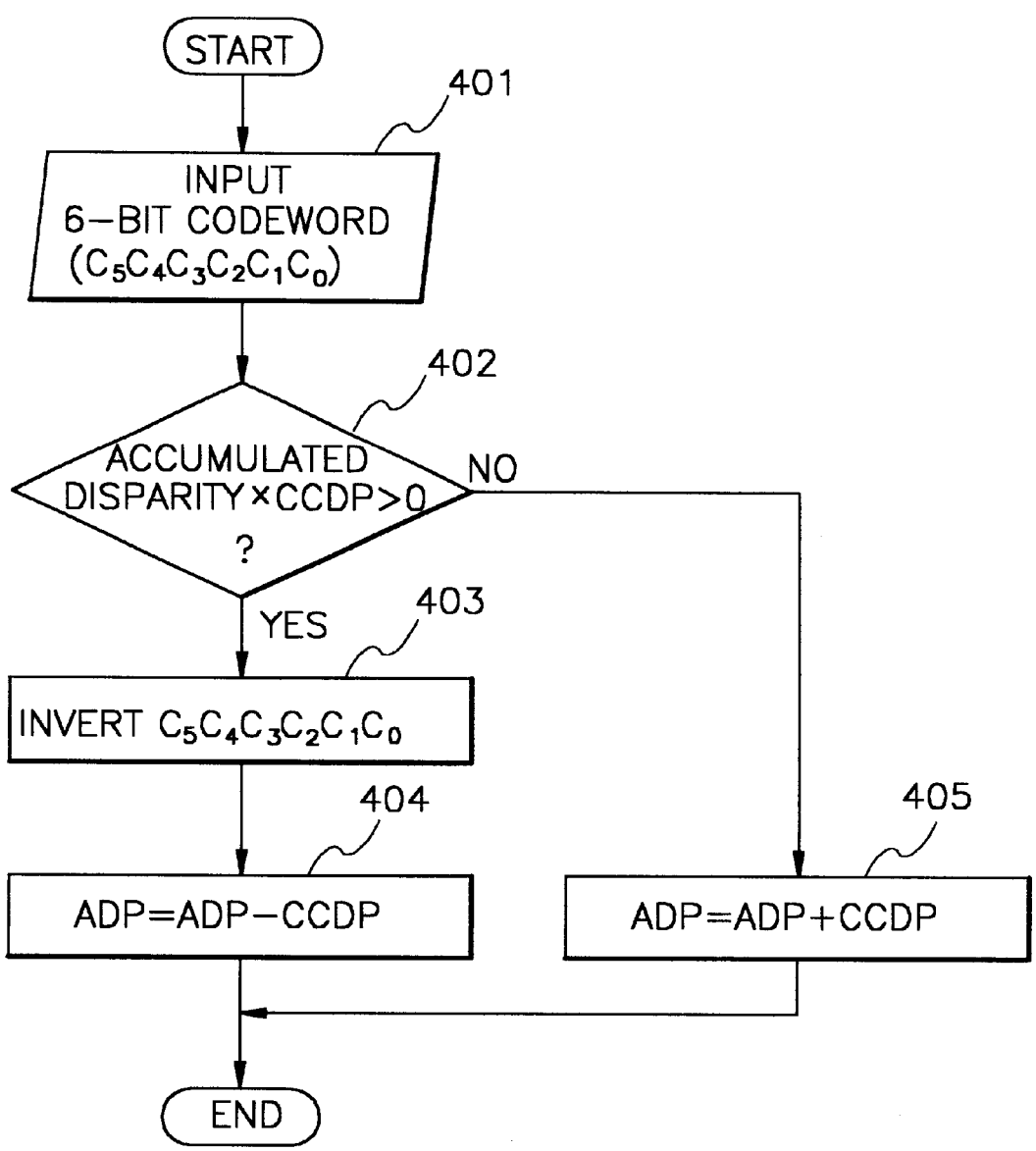
FIG. 4 shows a processing flow chart of bit inversion of 5B6B line code in accordance with the first preferred embodiment of the present invention.
Figure 5:
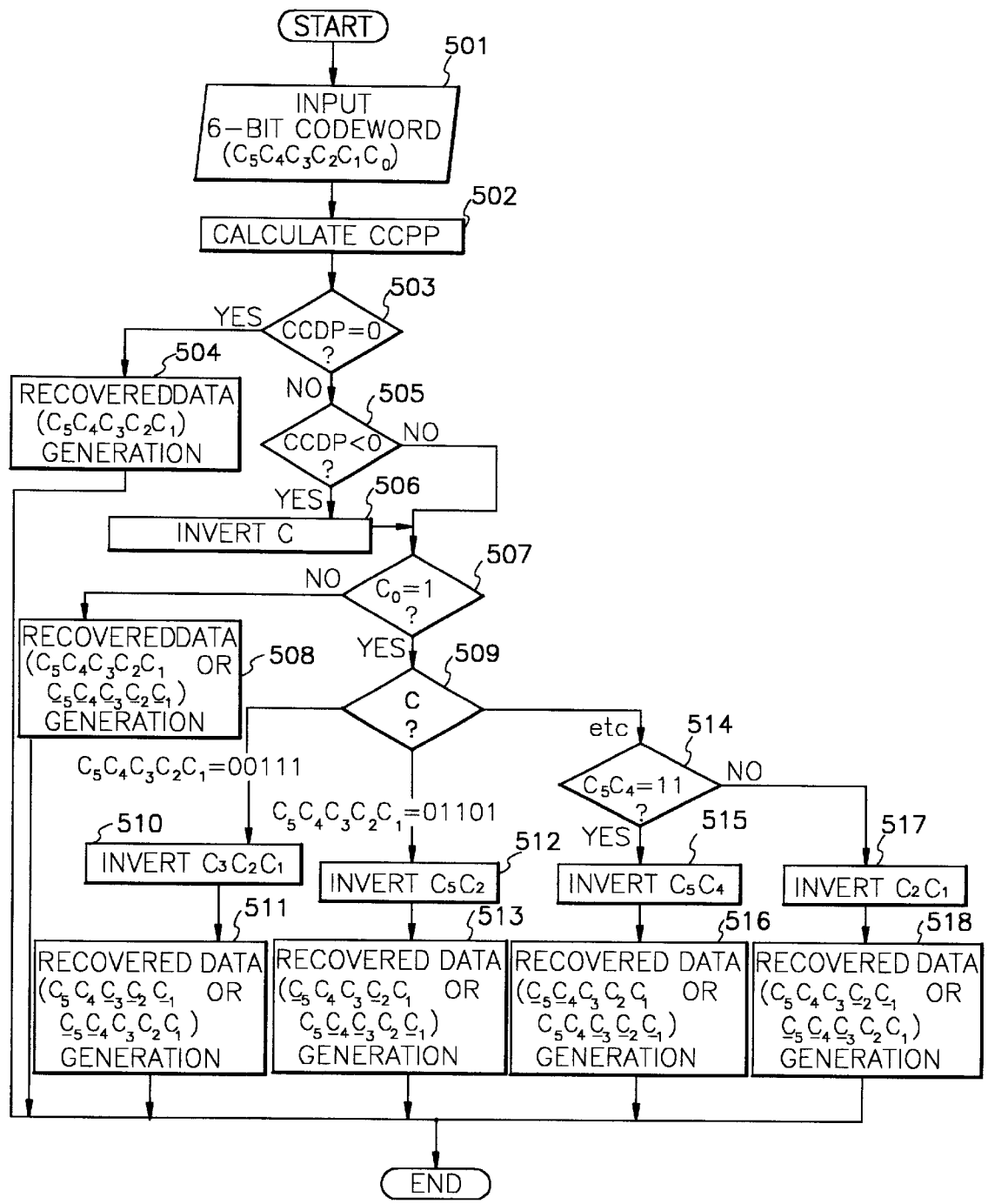
FIG. 5 shows a processing flow chart of decoding of 5B6B line code in accordance with the first preferred embodiment of the present invention.

FIG. 3 shows a processing flow chart of pre-coding and bit manipulation of 5B6B line code in accordance with a first preferred embodiment of the present invention, and FIG. 4 shows a processing flow chart of bit inversion of 5B6B line code in accordance with the first preferred embodiment of the present invention. FIG. 5 shows a processing flow chart of decoding of 5B6B line code in accordance with the first preferred embodiment of the present invention.

Referring first to FIG. 1, the coding apparatus of BIM line code includes a disparity calculator 101 calculating a disparity (DP) with respect to m-bit information data D[m:1]; an insertion bit generator 102 generating an insertion bit in response to an output DP of disparity calculator 101; an m+1 bit register 103 producing an m+1 bit block PCD[m+1:1] pre-coded by using the applied information data and insertion bit IB output from insertion bit generator 102; a bit manipulator 105 performing a bit manipulation with respect to an output signal of m+1 bit register 103 to produce a code CD[m+1:1]; a bit manipulation controller 104 producing a control signal BM for bit manipulation to bit manipulator 105 according to the applied information and disparity DP; a block inverter 107 performing a selective block inversion with respect to code CD[m+1:1], output from bit manipulator 105, to produce inverted data [ID[m+1:1]; and a block inversion controller 106 producing a control signal BL1 for the block inversion according to disparity DP and sending it to block inverter 107.

Insertion bit generator 102 produces a value for minimizing the disparity value of m+1 bit block as insertion bit IB when disparity DP is the minimum value that a m-bit block may have, and generates '0' except that case. The disparity is a value obtained by subtracting the number of 0's from the number of 1's of the applied information data. If m is an even number, the minimum value of disparity is '0', and if m is an odd number, the minimum value is '±1'.

Therefore, when disparity DP of the m-bit is '0', insertion bit generator 102 either produces '1' as an insertion bit to make disparity DP of the m+1-bit '1', or generates '0' to make the disparity of the m+1 bit '−1'. If the disparity of the m-bit equals '1', it produces '0', and if the disparity of the m-bit equals '−1', it produces '1', thus making the disparity of the m+1 bit '0'.

Bit manipulation controller 104 produces a control signal BM that lets bit manipulator 105 manipulate a part of bits with respect to a block other than a block having a disparity of minimum value among blocks pre-coded in m+1 bit register 103 in order to minimize a digital sum variation (DSV) of the overall block and sends the control signal to bit manipulator 105. Bit manipulator 105 manipulates bits according to control signal BM, and converts the insertion bit to '1' with respect to blocks having manipulated bits to generate a codeword, thus showing that bit manipulation has been accomplished.

Block inversion controller 106 accumulates disparity of each block that has been transmitted so far in order to maintain running digital sum RDS '0', and compares the polarity of disparity output from disparity calculator 101 with the polarity of the accumulated disparity. Controller 106 produces to block inverter 107 a control signal BL1 for inverting the block if the polarities are identical to each other, and for non-inverting the block if they are different from each other. Block inverter 107 outputs data with inversion of the block or without inversion of the block in response to control signal BL1.

In the operation of the encoding apparatus of the present invention, if the m-bit information data D[m:1] is transmitted to m+1 bit register 103 and disparity calculator 101, disparity calculator 101 calculates disparity DP of the applied information data D[m:1] and outputs it, and insertion bit generator 102 generates an insertion bit IB on receipt of the disparity output from disparity calculator 101 according to the rule of Table 1. As shown in Table 1, if the bit number of the applied information data is odd one and the disparity of the information data is '+1' or '−1', insertion bit is '0' or '1', so disparity of m+1 bit pre-coded word obtained by adding the insertion bit into the m-bit information data becomes a minimum value '0', and all the insertion codes are '0' if the disparity of the information data is not ±1. When the bit number of the information data is even one and the disparity of the information data is '0', the disparity of pre-coded word is minimized to '1' or '−1' by adding the insertion bit '0' or '1', and if the disparity of the information data is not '0', all the insertion codes are '0'.

TABLE 1

| Bit number | Disparity | Insertion bit |
|---|---|---|
| Odd number | +1 | 0 |
| | −1 | 1 |
| | the others (±3,5,7, . . . ) | 0 |
| Even number | 0 | 0 (or 1) |
| | the others (±2,4,6, . . . ) | 0 |

The above m+1 bit register 103 produces an m+1-bit pre-coded word [PCD (m+1:1)] by using the m-bit input data and the above insertion bit. Bit manipulator 105 manipulates a part of bits of the m+1 bit pre-coded block to make the m+1 bit pre-coded block have a disparity value close to the minimum value according to control signal BM of bit manipulation controller 104 if the m+1 bit pre-coded block does not have zero disparity, and produces it as a codeword CD[m+1:1].

Block inverter 107 inverts or non-inverts codeword CD[m+1:1] according to control signal BL1 of block inversion controller 106, and accumulates a value determined by subtracting an absolute value of the disparity of the inverted or non-inverted codeword from the disparity value accumulated so far as the accumulated disparity of the transmitted data.

FIG. 2 is a block diagram showing a decoding apparatus of BIM line code in accordance with a first preferred embodiment of the present invention.

Referring to FIG. 2, the decoding apparatus of the present invention includes a disparity calculator 201 calculating a disparity of block-synchronized received data RD[m+1:1] and outputting it; an m+1 bit register 202 separating the least significant bit LSB of the block-synchronized received data RD[m+1:1], added as an insertion bit when coding is executed, from the rest part [RD(m+1:2)] other than the LSB for decoding; and a block inversion check 203 monitoring whether or not the polarity of the disparity output from disparity calculator 201 is identical to that defined for all the respective codewords in the coding apparatus to check whether or not if the received block is inverted, thus producing a control signal RBL1; a block inverter 204 recovering the received block to the original block according to control signal RBL1 if block inversion check 203 determines that the block is inverted, and producing the block intact if block inversion check 203 determines that the block is not inverted; a bit manipulation controller 205 checking whether or not bit manipulation is performed at the time of coding according to insertion bit (LSB) output from m+1 bit register 202, and, when the bit manipulation is performed at the time of coding, carrying out manipulation opposite to that manipulation to produce a block bit manipulation control signal (RBM) for recovering to the original information data prior to coding; and a bit manipulator 206 recovering the information data by performing the inverse manipulation with respect to the block produced from block inverter 204.

The following description relates to the operation of the decoding apparatus of the present invention.

When disparity calculator 201 calculates and outputs a disparity with respect to the received codeword, m+1 bit register 202 separates the upper m bit RD[m+1:2} of the received m+1 bit codeword RD[m+1:1] from the insertion bit LSB that was inserted during coding for decoding. Block inversion check 203 monitors whether or not bits are inverted according to disparity RDP of the applied codeword calculated by disparity calculator 201, thus producing its result RLB1. According to the method of checking the bit inversion, if the polarity of the disparity of the rest of codewords except the codeword having the minimum disparity value is the same as a polarity of the disparity defined by the transmitting part, the inversion is not made, and if not so, the inversion is made. If the codeword is inverted, block inverter 204 inverts the same again on receipt of output RBL1 of block inversion check 203, and if the codeword is not inverted, inverter 204 outputs the same intact to recover to its original codeword RC[m:1]. Bit manipulation controller 205 receives the bits of recovered codeword RC[m:1] and the applied insertion bit, and detects the bit manipulation state. Controller 205 also manipulates bits of the manipulated codeword and produces control signal RBM for recovering to the original information data. Bit manipulator 206 performs bit manipulation opposite to the manipulation in the coding apparatus on receipt of the bit manipulation signal output from bit manipulation controller 205 to recover the original information data (RDO[m:0])

The following description concerns the coding/decoding process of the information data of 5 bits (m=5).

Referring to FIGS. 1 and 3, in the pre-coding and bit manipulation processes, when 5-bit information data (DI: $B_4B_3B_2B_1$, $B_0$) is externally applied (301), disparity calculator 101 calculates (302) disparity DP with respect to the applied data, and checks (303) if its disparity DP is ±1. If DP is '1', it adds (304, 305) '0' as the insertion bit. If DP is '−1', it adds (304, 306) '1' to make the disparity zero, thus generating (307) coded data $B_4B_3B_2B_1B_0I$.

If the calculated disparity is not ±1, the insertion bit '0' is added (308) to perform pre-coding, and disparity CDP of the pre-coded block is found (309) by subtracting '1' from disparity DP found by disparity calculator 101. If disparity DP of the pre-coded block is found +2 through checking (310), coded data $_4B_3B_2B_1B_0I$ is generated (307), which corresponds to the current state to which the insertion bit is inserted. If disparity CDP is not +2, the insertion bit is inverted to be '1' (311), and it checks (312) whether or not the disparity of the pre-coded block is '−4'. When the disparity of the pre-coded block is '−4', it checks (313) whether or not $B_4B_3$ are all '0'. If $B_4B_3$ are 00, disparity becomes '+2' by inverting $B_4B_3$(314), and then coded data $\underline{B_4,B_3}B_2B_1B_0I$ is produced (315). When $B_4B_3$ are not '00', $B_1B_0$ are inverted to make the disparity '+2' and the coded data $B_4B_3B_2\underline{B_1B_0}I$ is generated (317).

When disparity CDP of the pre-coded block is not '−4', it checks (318) whether disparity DP of the applied 5-bit information is positive or negative. When disparity DP is negative, $B_4B_3$ are inverted (314) to make disparity +2, and coded data $\underline{B_4},B_3B_2B_1B_0I$ are produced (315). When disparity DP is positive, $B_4B_2B$, are inverted (319) to make disparity +2, and coded data $\underline{B_4}B_3\underline{B_2}B_1,B_0I$ is produced (320).

If the coded data generated by the above process have a minimum disparity value, its disparity is '0', and if not so, the disparity is all '+2'.

FIG. 4 is a flow chart of the bit inversion.

Referring to FIG. 4, in the bit inversion process, when coded 6-bit data block $C_5C_4C_3C_2C_1C_0$ is applied (401), it is checked whether or not the sign of disparity CCDP of the coded block is equal to that of disparity ADP of the data that has been transmitted and accumulated so far. If the sign of the disparities are different from each other, the block is not inverted to maintain the RDS '0', and if the sign of the disparities are the same, the block is inverted (403) to maintain the RDS '0'. After the selective inversion, ADP is made by subtracting CCDP from previous ADP if the coded block was inverted (404). If the coded block was not inverted, ADP is made by adding CCDP to previous ADP (405).

Table 2 is a code table of codewords generated by the above pre-coding bit insertion/bit manipulation.

Referring to Table 2, the minimum disparity value that the 6-bit block may have is maintained by limiting the absolute value of the disparity of the codeword to less than '2' (0 or +/−2), so the RSV can be minimized. In addition, all the codewords except codewords with block's disparity of zero have negative and positive disparities, and the mean RDS of the block transmitted can be maintained as '0' by transmitting a positive or negative disparity according to the accumulated disparity value of the block already transmitted.

Table 2

| No. | INFORMATION | DISPARITY | CODEWORD | DISPARITY |
|---|---|---|---|---|
| [0] | 00000 | −5 | 001111 | +2 |
|  |  |  | [110000] | −2 |
| [1] | 00001 | −3 | 110011 | +2 |
|  |  |  | [001100] | −2 |
| [2] | 00010 | −3 | 110101 | +2 |
|  |  |  | [001010] | −2 |
| [3] | 00011 | −1 | 000111 | 0 |
| [4] | 00100 | −3 | 111001 | +2 |
|  |  |  | [000110] | −2 |
| [5] | 00101 | −1 | 001011 | 0 |
| [6] | 00110 | −1 | 001101 | 0 |
| [7] | 00111 | +1 | 001110 | 0 |
| [8] | 01000 | −3 | 010111 | +2 |
|  |  |  | [101000] | −2 |
| [9] | 01001 | −1 | 010011 | 0 |
| [10] | 01010 | −1 | 010101 | 0 |
| [11] | 01011 | +1 | 010110 | 0 |
| [12] | 01100 | −1 | 011001 | 0 |
| [13] | 01101 | +1 | 011010 | 0 |
| [14] | 01110 | +1 | 011100 | 0 |
| [15] | 01111 | +3 | 011110 | +2 |
|  |  |  | [100001] | −2 |
| [16] | 10000 | −3 | 100111 | +2 |
|  |  |  | [011000] | −2 |
| [17] | 10001 | −1 | 100011 | 0 |
| [18] | 10010 | −1 | 100101 | 0 |
| [19] | 10011 | +1 | 100110 | 0 |
| [20] | 10100 | −1 | 101001 | 0 |
| [21] | 10101 | +1 | 101010 | 0 |
| [22] | 10110 | +1 | 101100 | 0 |
| [23] | 10111 | +3 | 101110 | +2 |
|  |  |  | [010001] | −2 |
| [24] | 11000 | −1 | 110001 | 0 |
| [25] | 11001 | +1 | 110010 | 0 |
| [26] | 11010 | +1 | 110100 | 0 |
| [27] | 11011 | +3 | 110110 | +2 |
|  |  |  | [001001] | −2 |
| [28] | 11100 | +1 | 111000 | 0 |
| [29] | 11101 | +3 | 111010 | +2 |
|  |  |  | [00101] | −2 |
| [30] | 11110 | +3 | 111100 | +2 |
|  |  |  | [000011] | −2 |
| [31] | 11111 | +5 | 011011 | +2 |
|  |  |  | [100100] | −2 |

FIG. 5 is a flow chart of the decoding process in accordance with the present invention.

Referring to FIG. 5, in the decoding process when coded 6-bit data block $C_5C_4C_3C_2C_1C_0$ is applied (501), a disparity CCDP with respect to the applied codeword is computed (502). If disparity CCDP of the received codeword is '0', the applied insertion bit, $LSB(C_0)$, is removed and decoded data $C_5C_4C_3C_2C_1$ is produced (504). This is because, when the disparity is '0', the received codeword is the one which was obtained by coding the information data with ±1 disparity by adding the insertion bit only.

If disparity of the applied codeword is not '0', it checks (505) whether the disparity is positive or negative, and when the disparity of the codeword is negative, it means that the codeword is inverted, so it is inverted again (506). That is because all the codes, produced from the coding part, are '0' or '+2' prior to inversion, and when the disparity of the codeword is positive, it means the codeword is not inverted, so the inversion is not carried out again.

When the inversion process described above is completed, $LSB(C_0)$ value of the codeword is checked (507), and if this value is not '1' but '0', the LSB is removed and decoded data $C_5C_4C_3C_2C_1$ or $\underline{C_5C_4C_3C_2C_1}$ is produced. That is because the applied codeword is the information data which was completely coded without bit manipulation since the disparity of the applied codeword after bit insertion in the decoding part is +2.

If the LSB value ($C_0$) of the inverted codeword is '1', the bit value C of the codeword is checked (509), and if the bit value is $C_5C_4C_3C_2C_1$=00111, $C_3C_2C_1$ are inverted (510), and then the LSB is removed and the decoded data $C_5C_4\underline{C_3}$ $\underline{C_2}C_1$ or $\underline{C_5C_4C_3C_2C_1}$, is produced (511). If the bit value is $C_5C_4C_3C_2C_1$=01101, $C_5C_2$ are inverted (512), and then the LSB is removed and the decoded data $\underline{C_5}C_4\underline{C_3C_2}C_1$ or $C_5\underline{C_4}$ $C_3C_2C_1$ is produced (513). If this is not one of the above two cases, it checks whether or not $C_5C_4$ are '11'. When $C_5C_4$ are '11', they are inverted (515), and then the LSB is removed and decoded data $\underline{C_5C_4}C_3C_2C_1$ or $C_5C_4\underline{C_3C_2}C_1$ is produced (516). If $C_5C_4$ are not '11', $C_2C_1$ are inverted (517), and then the LSB is removed and decoded data $C_5C_4$ $C_3\underline{C_2C_1}$ or $\underline{C_5C_4C_3}C_2C_1$ is produced (518).

As described above, in the BIM line code of the present invention, used or coding/decoding in the coding/decoding apparatuses according to the bit insertion/manipulation, the run length of the same bits is limited to less than 7 bits in order to extract the timing information and reduce baseline fluctuations while maintaining the RDS as '0', and the maximum value of the DSV is 2, so the present invention usable for the line code for high-speed digital transmission system has the following advantages compared to the conventional method.

First, the increase in bit rate due to coding can be minimized by adding 1-bit insertion bit only into m-bit information data. Second, the present invention maintains the RDS required for the digital transmission system using the AC coupling as '0'. Third, the present invention can assure the high-speed coding/decoding by realizing coding and decoding apparatuses using logic circuits, compared to the look-up table method using the conventional ROM. Fourth, since a relatively simple digital circuit performs the coding/decoding, the high-speed performance is more easily realized by the present invention than by a method needing complicated coding/decoding circuits. Fifth, the present invention provides the simple in-service error monitoring by checking the codeword. Sixth, the present invention has bit sequence independence.

It will be apparent to those skilled in the art that various modifications and variations can be made in the coding/decoding system of line code of the present invention without departing from the spirit or scope of the invention. Thus, it is intended that the present invention covers the modifications and variations of this invention provided they come within the scope of the appended claims and their equivalents.

What is claimed is:

1. A coding apparatus of bit insertion/manipulation line code comprising:

disparity calculating means for calculating a disparity with respect to m-bit information data D[m:1];

insertion bit generating means for generating an insertion bit for minimizing a disparity of the m+1 bit information data in response to the disparity from said disparity calculating means;

m+1 bit register means for generating m+1 bit blocks PCD[m+1:1] pre-coded by using the applied m-bit information data and the insertion bit;

bit manipulation control means for producing a bit control signal for bit manipulation in order to minimize a digital sum variation (DSV) according to the applied m-bit information data and the disparity from said disparity calculator means;

bit manipulation means for manipulating a part of bits of the m+1 bit blocks pre-coded according to the bit control signal, and producing a codeword CD[m+1:1];

block inversion control means for producing a block control signal for block inversion in order to maintain a running digital sum (RDS) according to the disparity from said disparity calculator means; and block inversion means for performing a selective block inversion with respect to the codeword CD[m+1:1] according to the block control signal, and producing inverted data ID[m+1].

2. The coding apparatus as claimed in claim 1, wherein said block inversion control means accumulates the disparity of each block of the codeword CD[m+1:1] that has been transmitted in order to maintain the running digital sum (RDS), compares the polarity of the disparity from said disparity calculating means and the polarity of the accumulated disparity, and generates the block control signal if the polarity of the disparity from said disparity calculating means corresponds to the polarity of the accumulated disparity.

3. The coding apparatus as claimed in claim 2, wherein said block inversion means inverts or non-inverts the codeword CD[m+1:1] according to the block control signal, and accumulates a value determined by subtracting an absolute value of the disparity of the inverted or non-inverted codeword from the accumulated disparity.

4. The coding apparatus as claimed in claim 1, wherein said insertion bit generating means generates the insertion bit according to the following rules:

if the bit number of the applied m-bit information data is odd, and the disparity is "+1" or "−1", the insertion bit will be "0" or "1" respectively;

if the bit number of the applied m-bit information data is odd, and the disparity is not "+1" or "−1", the insertion bit will be "0";

if the bit number of the applied m-bit information data is even, and the disparity is "0", the insertion bit will be "0" or "1"; and if the bit number of the applied m-bit information data is even, and the disparity is not "0" or "1", the insertion bit will be "0".

5. A decoding apparatus of bit insertion/manipulation line code comprising:

disparity calculating means for calculating a disparity with respect to received codeword RD[m+1:1];

m+1 bit register means for separating upper m-bits of the received codeword from an insertion bit that was inserted during coding;

block inversion check means for checking for a bit inversion with respect to the upper m-bits of the received codeword, and producing a block control signal;

block inversion means for performing a selective block inversion with respect to the upper m-bits of the received codeword according to the block control signal;

bit manipulation check means for checking for a bit manipulation with respect to a block output from said block inversion means, and producing a bit control signal for recovering to information data prior to coding; and bit manipulation means for performing an inverse manipulation of coding with respect to the block output from the block inverting means in response to the bit control signal to thereby recover the information data.

6. The decoding apparatus as claimed in claim 5, wherein said block inversion check means monitors whether bits of the received codeword are inverted according to the disparity of the received codeword calculated by said disparity calculating means and produces the block control signal accordingly.

7. A coding/decoding system, comprising:

an encoder provided at one end of a transmission system for bit insertion/manipulation line code, said encoder comprising:

a disparity calculator arranged to calculate a disparity with respect to m-bit information data;

an insertion bit generator arranged to generate an insertion bit for minimizing a disparity of the m+1 bit information data in response to the disparity from said disparity calculator;

an m+1 bit register arranged to provide m+1 bit blocks PCD[m+1:1] pre-coded by using the applied m-bit information data and the insertion bit;

a bit manipulation controller arranged to produce a bit control signal for bit manipulation in order to minimize a digital sum variation (DSV) according to the applied m-bit information data and the disparity from said disparity calculator;

a bit manipulator arranged to manipulate a part of bits of the m+1 bit blocks pre-coded according to the bit control signal, and produce a codeword CD[m+1:1];

a block inversion controller arranged to produce a block control signal for block inversion in order to maintain a running digital sum (RDS) according to the disparity from said disparity calculator; and a block inverter arranged to perform a selective block inversion with respect to the codeword CD[m+1:1] according to the block control signal, and produce inverted data ID[m+1] as a codeword for transmission; and a decoder provided at the other end of said transmission system for bit insertion/manipulation line code, said decoder comprising:

a disparity calculator arranged to calculate a disparity with respect to a received codeword RD[m+1:1];

an m+1 bit register arranged to separate upper m-bits of the received codeword from the insertion bit that was inserted during coding, via said encoder;

a block inversion checker arranged to check for a bit inversion with respect to the upper m-bits of the received codeword, and produce a block control signal;

a block inverter arranged to perform a selective block inversion with respect to the upper m-bits of the received codeword according to the block control signal;

a bit manipulation checker arranged to check for a bit manipulation with respect to a block output from said block inverter, and produce a bit control signal for recovering to information data prior to coding; and a bit manipulator arranged to perform an inverse manipulation of coding with respect to the block output from the block inverter in response to the bit control signal to thereby recover the information data.

8. The coding/decoding system as claimed in claim 7, wherein said block inversion controller of said encoder accumulates the disparity of each block of the codeword CD[m+1:1] that has been transmitted in order to maintain the running digital sum (RDS), compares the polarity of the disparity from said disparity calculator and the polarity of the accumulated disparity, and generates the block control signal if the polarity ofthe disparity from said disparity calculator corresponds to the polarity of the accumulated disparity.

9. The coding/decoding system as claimed in claim 8, wherein said block inverter inverts or non-inverts the codeword CD[m+1:1] according to the block control signal, and accumulates a value determined by subtracting an absolute value of the disparity of the inverted or non-inverted codeword from the accumulated disparity.

10. The coding/decoding system as claimed in claim 7, wherein said insertion bit generator of said encoder generates the insertion bit according to the following rules:

if the bit number of the applied m-bit information data is odd, and the disparity is "+1" or "−1", the insertion bit will be "0" or "1" respectively;

if the bit number of the applied m-bit information data is odd, and the disparity is not "+1" or "−1", the insertion bit will be "0";

if the bit number of the applied m-bit information data is even, and the disparity is "0", the insertion bit will be "0" or "1"; and if the bit number of the applied m-bit information data is even, and the disparity is not "0" or "1", the insertion bit will be "0".

11. The coding/decoding system as claimed in claim 7, wherein said block inversion checker of said decoder monitors whether bits of the received codeword are inverted according to the disparity of the received codeword calculated by said disparity calculator and produces the block control signal accordingly.

* * * * *